US005611013A

United States Patent [19]
Curzio

[11] Patent Number: 5,611,013
[45] Date of Patent: Mar. 11, 1997

[54] OPTICAL MINIATURE CAPSULE

[75] Inventor: Peter L. Curzio, Álvajö, Sweden

[73] Assignee: Telefonaktiebolaget LM Ericsson, Stockholm, Sweden

[21] Appl. No.: 490,508

[22] Filed: Jun. 14, 1995

[30] Foreign Application Priority Data

Jun. 14, 1994 [SE] Sweden .................. 9402082

[51] Int. Cl.⁶ .................................. G02B 6/36
[52] U.S. Cl. .................................. 385/89; 361/778
[58] Field of Search .................. 361/748, 767, 361/778; 385/88–94

[56] References Cited

U.S. PATENT DOCUMENTS

| | | | |
|---|---|---|---|
| 4,182,545 | 1/1980 | Greer | 350/96.2 |
| 4,316,204 | 2/1982 | Inagaki et al. | 357/30 |
| 4,781,429 | 11/1988 | Cartier | 350/96.2 |
| 4,840,451 | 6/1989 | Sampson et al. | 350/96.2 |
| 5,035,483 | 7/1991 | Waitl et al. | 350/96.2 |
| 5,113,466 | 5/1992 | Acarlar et al. | 385/88 |
| 5,123,066 | 6/1992 | Acarlar | 385/14 |
| 5,127,071 | 6/1992 | Go | 385/73 |
| 5,155,784 | 10/1992 | Knott | 385/88 |
| 5,170,453 | 12/1992 | Go et al. | 385/70 |
| 5,199,093 | 3/1993 | Longhurst | 385/88 |
| 5,363,280 | 11/1994 | Chobot et al. | 361/778 |
| 5,394,490 | 2/1995 | Kato et al.1 | 385/88 |
| 5,450,290 | 9/1995 | Boyko et al. | 361/778 |

FOREIGN PATENT DOCUMENTS

| | | |
|---|---|---|
| 0017701A1 | 1/1980 | European Pat. Off. . |
| 0535473A1 | 9/1992 | European Pat. Off. . |
| 596613 | 11/1994 | European Pat. Off. . |
| 92/07378 | 4/1992 | WIPO . |
| 93/19487 | 9/1993 | WIPO . |
| 94/28448 | 12/1994 | WIPO . |

*Primary Examiner*—John Ngo
*Attorney, Agent, or Firm*—Burns, Doane, Swecker & Mathis, L.L.P.

[57] ABSTRACT

Optoelectronic active/passive components (15) are directly mounted to a front surface of a capsule (1) of an electrically isolating, opaque material. The surface on which the components (15) are mounted is retracted in relation to other parts of the front surface where holes (11) for guide pins of a connectable coupling device (7) for optical fibers are provided. The components (15) are electrically connected to, e.g. by means of loose wires, conductor paths (17) also arranged on the retracted front surface part. In a particular designed mounting method the optical components may be provided in the shape of a plate having its electric terminals at its rear side. On the electric terminals isles, e.g. of tin solder, are placed, the plate is placed at the front side of the capsule, where holes are provided extending into the capsule up to electric conductive paths inside the capsule, and the soldering isles are heated so that the tin solder flows into the holes and contacts the electric conductors therein.

15 Claims, 9 Drawing Sheets

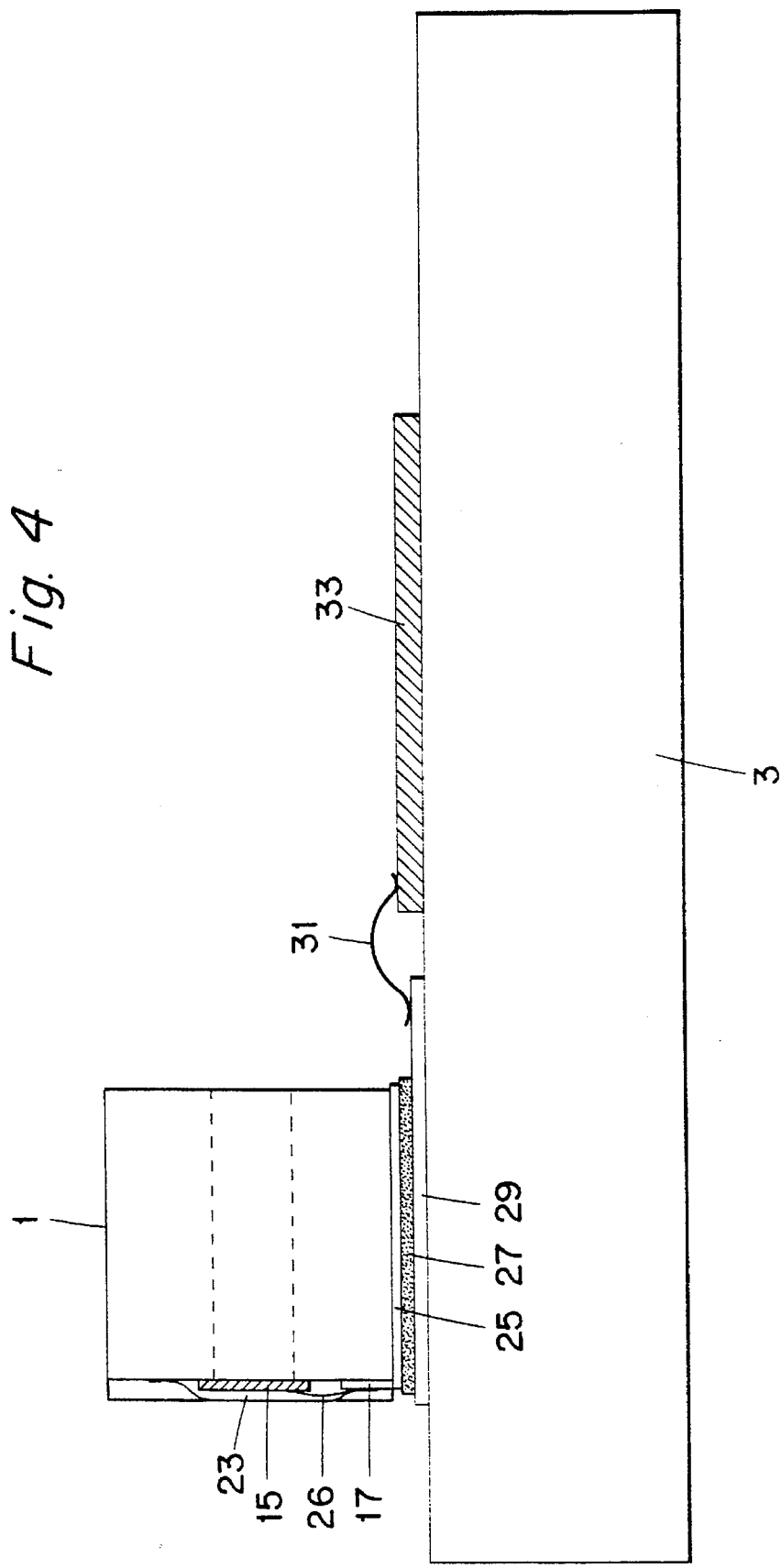

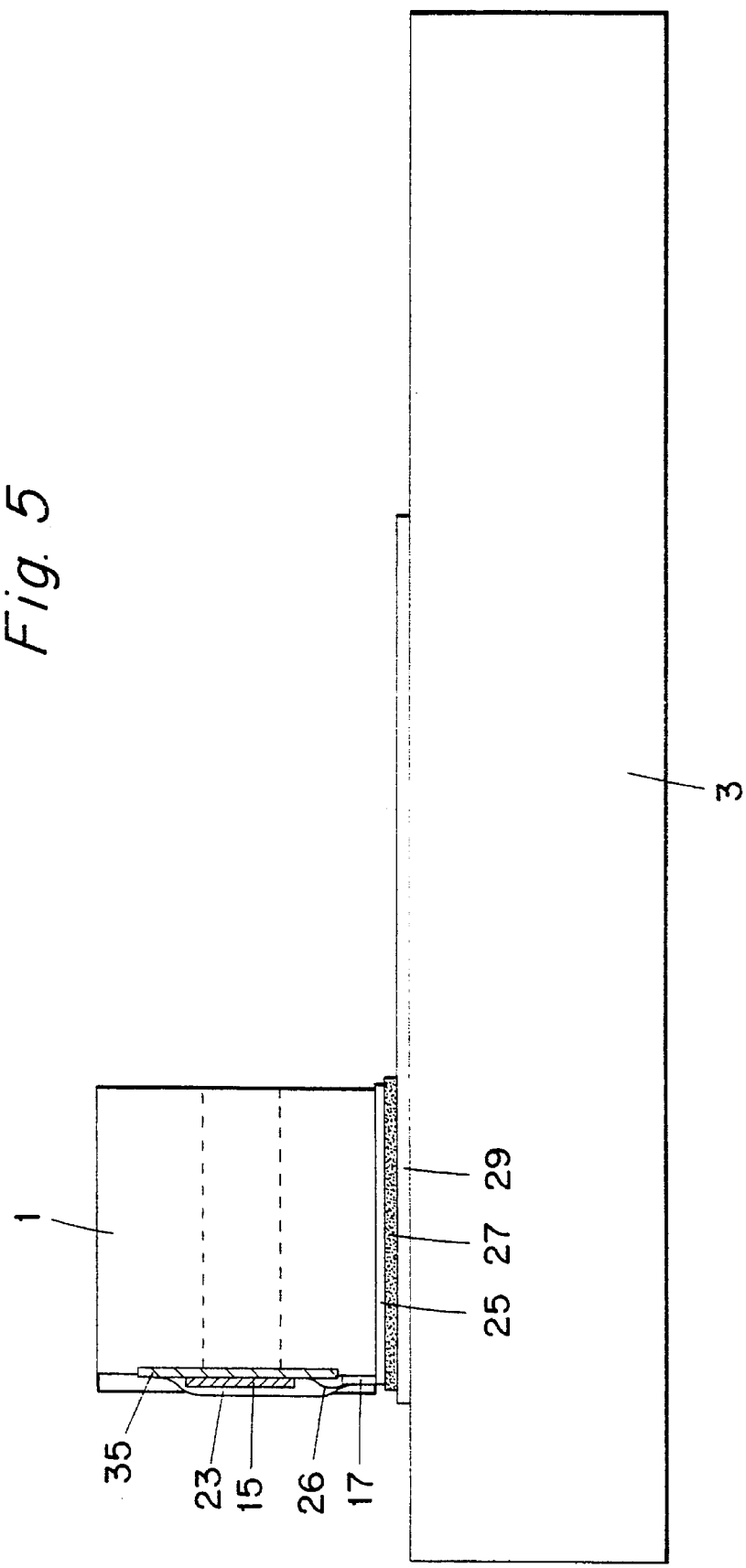

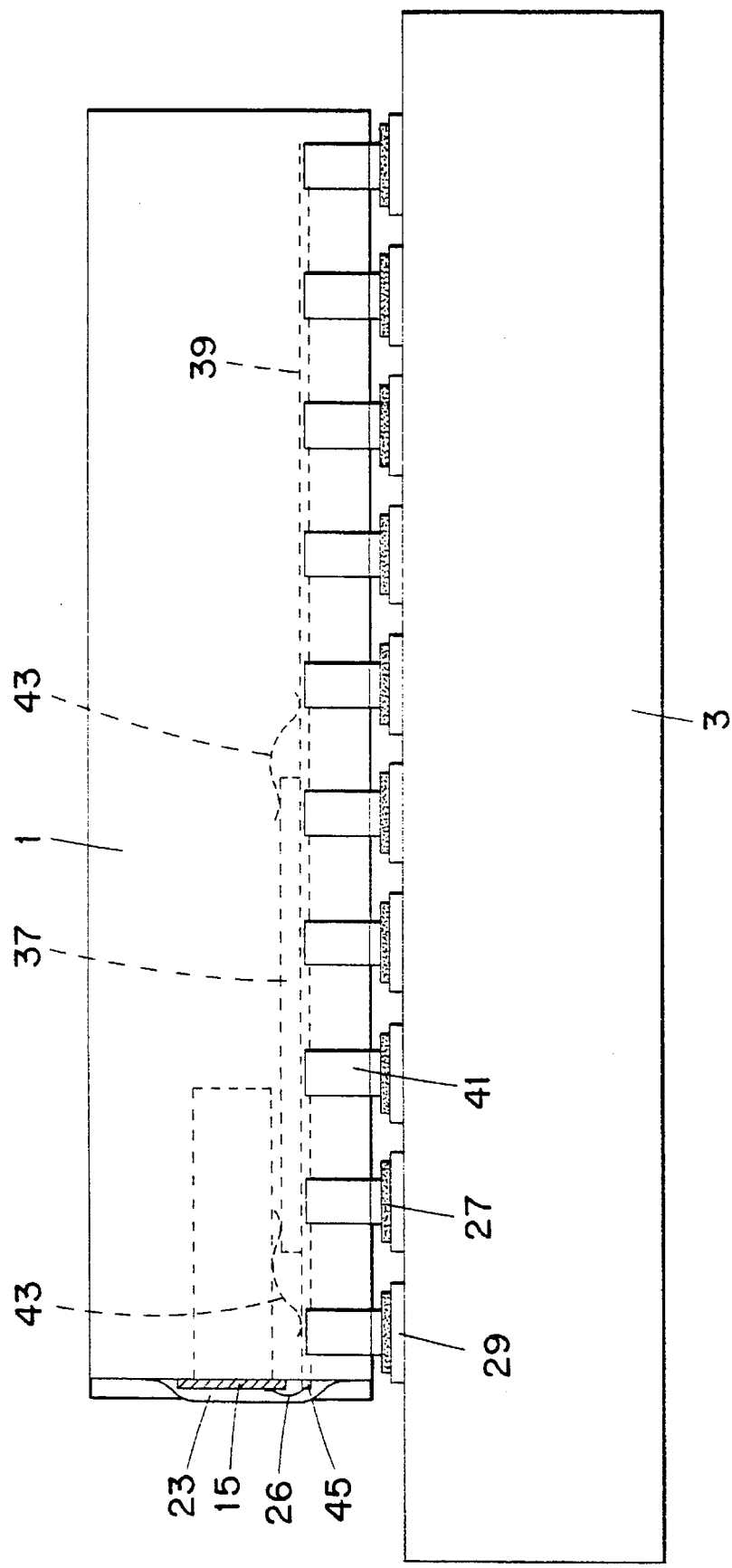

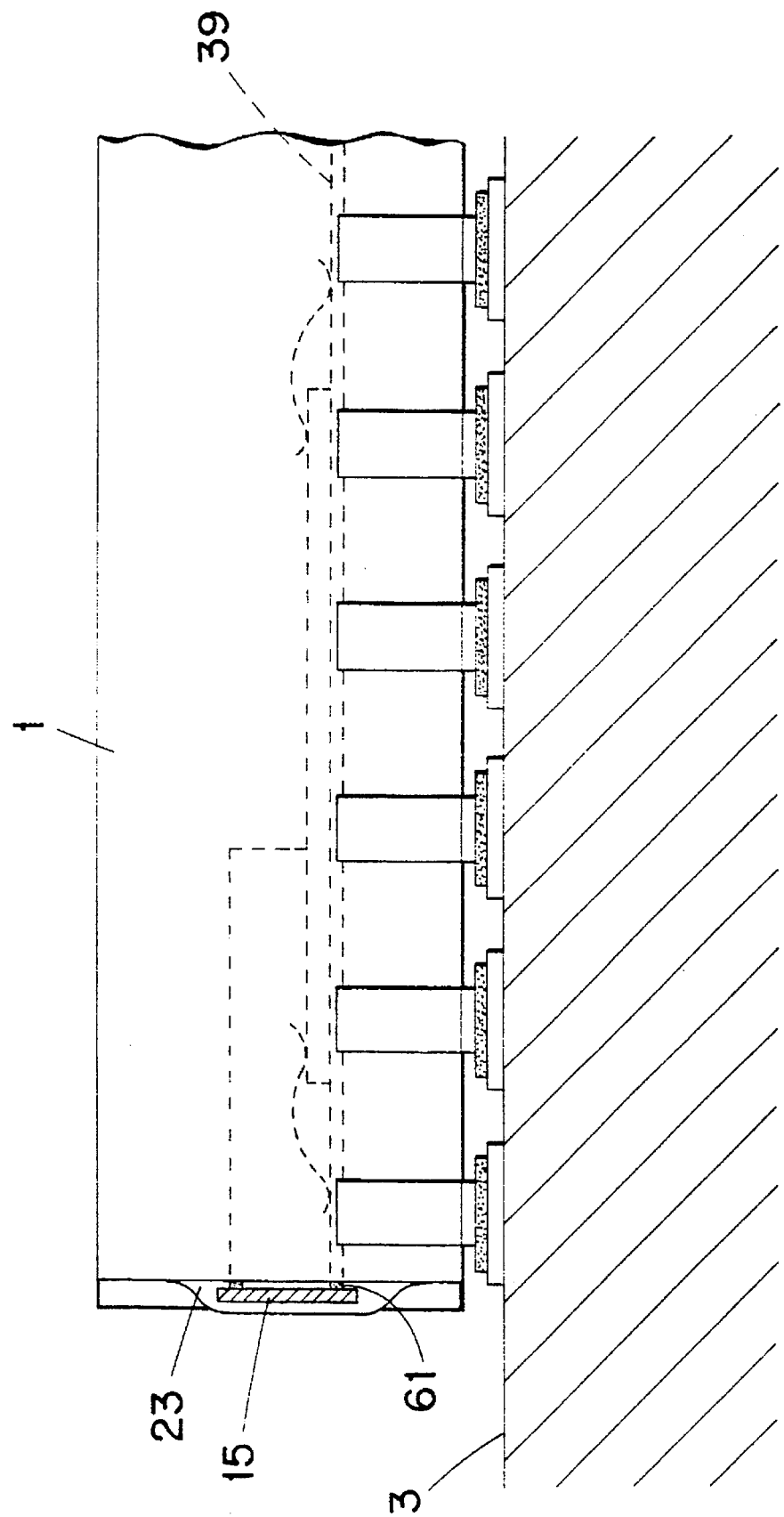

OPTICAL MINIATURE CAPSULE

TECHNICAL FIELD

The present invention relates to miniature capsules comprising surface mounted and/or encapsulated optoelectric elements, such as photodetectors (PD), light emitting diodes (LED) and/or laser diodes (LD), possibly integrated with other electronic circuits, and methods for an accurate positioning of an optocomponent on a support or substrate and for production of such a mounted optocomponent.

BACKGROUND

Most of the optical components of today such as optical transmitters and optical receivers for high velocity communication on optical fibers are constructed, so that a permanent connection of an optical fiber is made to an active surface of the optical component. In order to achieve such a connection extremely accurate active adjustment of the fiber end is required to find the correct position at the surface of the optical component. It is also conventional, that the component is encapsulated together with a piece of an optical fiber which is fixedly mounted, so that a so called "pigtail" is obtained, i.e. so that a fixedly mounted fiber piece extends permanently from the within capsule. The encapsulation can be made hermetically with a metal material or by means of ceramics. This method for connection by a "pigtail" results in the fact that the finished encapsulated components will have a time consuming production, will be very costly, will have a large volume and do not allow connectable and detachable connections to an optical fiber.

STATE OF THE ART

The U.S. Pat. Nos. 5,123,066, 5,127,071, 5,113,466 and 5,170,453 describe miniature capsules, designed so that connectable and detachable contacting of optical fibers provided with connector means can be made directly to encapsulated surface mounted photodetectors (PD), light emitting diodes (LED) and/or laser diodes (LD).

In the patent U.S. Pat. No. 5,199,093 multi-part optical fiber connectors are disclosed, where a passive integrated optical chip is disposed at the coupling surface of a connector for optical coupling directly to ends of optical fibers located inside another connector. The optical chip has its own optical coupling surfaces located in the same level or plane as the remaining portion of the coupling surface.

An optoelectronic assembly disclosed in the European patent application EP-A1 0 535 473 comprises two components, transmitter and receiver components, movably arranged in a housing. A alignment member is secured to the housing producing an alignment of the components to an optical connector when the connector is positioned within the alignment member.

The International patent application WO 94/28448, having a priority date earlier than the present application but published after the filing of the present application, discloses an optical interconnect for coupling the ends of multiple optical fibers directly to the active surfaces of an array of optoelectronic devices located on an optoelectronic board. Guiding pins and tunnels/guide bores are provided for the alignment of a multifiber connector to the optodevices.

In the International patent application WO 93/19847 an integrated circuit module is disclosed which has microscopic self-alignment features. The module comprises an integrated circuit chip and an interconnect member having surfaces facing each other. One of the surfaces has shallow holes and the other surface has protrusions which are shaped to fit into the holes and prevent the surfaces from sliding on each other.

SUMMARY

It is an object of the invention to provide a capsule comprising optoelectronic components, to which a connectable and detachable connection of an optical fiber or a group of optical fibers provided with suitable connector means can be accomplished, so that the fibers are directly coupled to the capsule.

It is another object of the invention to provide a capsule comprising optoelectronic components, to which a connection of a group of optical fibers provided with suitable connector means can be accomplished, the capsule being constructed to protect the optoelectronic components being damaged or destroyed when a fiber connector is pushed against the capsule.

It is a further object of the invention to provide a capsule comprising optical components, which can in a simple way be mounted on circuit boards and has reasonable dimensions.

It is a further object of the invention to provide a capsule comprising optical components, which allows a connection to optical fibers in an accurate way and which has a low cost of production.

It is a further object of the invention to provide a method for accurately mounting, in a simple way which can be easily automatized, an optocomponent chip on a substrate or support.

The objects mentioned above are achieved by the invention, the characteristics and features of which appear from the following description and the appended claims.

A miniature capsule comprising surface mounted and/or encapsulated optoelectric components, possibly integrated with other electronic circuits, is designed so that a detachable connector means for optical fibers can be placed against the capsule, whereby the end surfaces of the optical fibers are coupled directly, with an accurate adjustment, to the active surface of the components. The components can either be individual or comprising a multitude of components, placed side by side in the shape of an array. Preferably the capsule is designed with an interface for multifiber connectors having guide pins (conventional types MT, MAC II). The mounted optoelectric components are protected by covering them with a transparent, rubber like material, which in addition acts as an intermediate or transitional material having an adapted refractive index for reduction of reflections at the interface between the end surfaces of the fibers and the surface of the components.

An optical component capsule can have the shape of a substantially rectangular block and comprises at least one optoelectronic component having at least one optical exterior connection, i.e. for example a suitable exterior surface, to a light wave guide and comprising electrical connections at the surface of the capsule. The component is mounted on a lateral surface or a top surface of the capsule, so that its optical connection is located freely or accessible for coupling to some light wave guide connector means. Guides are provided for receiving guide means of the connector, such as guide pins, arranged in or at the capsule, having axes which extend inwards through the plane of the same side surface of the component. The guides can be of the type which is arranged at MT connectors and then comprise bores having axes extending into the side surface perpendicularly thereto.

The component is mounted in a recess in the surface of the capsule, so that e.g. the optical connection surfaces of the components or at least the surfaces thereof to which the fiber ends are to coupled, are located approximately in the level of or somewhat inside or retracted in relation to that portion of the surface where the recess is not arranged, for protection of the components and for facilitating the coupling to an exterior light wave-guide or exterior light wave-guides. The surface of the capsule where the component is mounted, thus comprises a first portion where the component is mounted and a second portion for contact with a flat front surface of a connector and into and through which the bores for the guide pins may extend and the first portion is retracted in relation to the second portion, that is has a position more close to the body or centre of the capsule, these surface portions being generally located parallel to each other.

For connection to electrical terminals of the component electrical conductors can be provided, which are also located on the retracted surface of the capsule where the component is mounted. These conductors can then continue from this surface to a bottom surface of the capsule where it is to be placed on and attache to a substrate or support such as a circuit board. At the bottom surface the conductors can be connected to other electrical conductors, e.g. in the shape of printed pattern conductive paths, on the substrate or support.

In the embodiment for connection to a MT connector the capsule has two bores for guide pins and if the component only has one optical coupling surface, the component is then advantageously mounted so that this optical exterior coupling is located having its centre point on the connection line between the bores for the guide pins, in particular between the axes of the bores, and preferably even its optical exterior coupling area is located having its centre point arranged centrally between the holes, i.e. at the centre of the connection line.

In the case where the component has several optical coupling terminals or coupling areas or comprises several components having each one at least one exterior optical coupling terminal, the component/components are preferably mounted so that the optical exterior coupling areas are located having their centres evenly distributed and centred on the connection line between the bores for the guide pins. In that case the component can e.g. comprise several individual components which are mounted on or produced in a plate-shaped carrier attached to the retracted side surface of the capsule.

When mounting the component to a side or surface of the capsule generally a very good accuracy is required in regard of the positioning of the component so that its optical coupling surface/coupling surfaces are located exactly correctly in relation to the guides for the guiding means such as guide pins. For this alignment a modified Flip Chip method can be used which simultaneously produces an alignment of the component in an accurately predetermined position and the electrical connection of component. This method can also be used generally for a simple mounting, which is suited for automatization and provides a high accuracy, of small components to a substrate or support.

Therefor, in a surface of the support or substrate first holes are produced which extend inwards from the surface at least some distance into the support. These holes can suitably be produced simultaneously with the support and with the surface or the surface layer of the support such as in moulding it. The support can be an electrically isolating block as above having electrical conductors located therein and moulded therein, for forming an optical capsule. At a side of a component plate bumps, heaps or small contiguous amounts of a material, which is liquid when heated and is in room temperature essentially solid or semi-solid, in particular a tin solder material or a curable adhesive, in the shape of small "isles" which can be in an electrical contact with electrical conductors in or on the component plate. The isles are placed directly correspondingly to the holes or generally having positions in relation to each other which are adapted to the relative positions of the holes to each other, so that when the plate is in a correct position above that surface, where the holes are located, the axis of each hole extends through the centre of a corresponding isle.

Then the plate is placed over the support having each one of its bumps at least partly located above a corresponding hole and restrictedly free to move along the surface, e.g. so that the surface of the support is directed upwards and the plate rests on this surface, there being a not too large friction in relation thereto. The bumps are then heated, so that the material therein will be liquefied and then passes into the corresponding hole. The surface tension forces in the material which is now liquid will cause the plate to be displaced to a predetermined, correct and intended position at the surface of the support. At last the material in the bumps is allowed to solidify, in particular by allowing it to cool. If the holes in the support have been made in and up to electrical conductors inside the support, the material can when it is liquid, if the conductors are not located too deeply in the holes, come in contact with such a conductor and thereby accomplish an electrical contact, when the material itself is electrically conductive.

Generally the holes have a very small diameter, typically of the magnitude of order of 0.1 mm. They can be made as blind holes having a very small depth, which can be of the same magnitude of order as the diameter, and then advantageously an electrical conductor is located at the bottom of such holes.

By this method an optical component capsule can be produced, comprising an optoelectronic component plate having electrical connection terminals. In the capsule there is then a support or substrate comprising an electrically isolating material having electrical conductor paths. At a surface of the isolating material holes are provided which extend in the isolating material in and up to portions of electrical conductor paths located below the surface. In the finished capsule the plate has electrical connections at one side in the shape of protrusions of an electrically isolating material which extend into the holes from the surface of the isolating material and therein is in electrical contact with portions of the electrical conductor paths. The support or substrate can advantageously be a block of an electrically isolating material comprising electrical conductor paths moulded therein of an electrically conducting material, in particular of a metal such as copper.

BRIEF DESCRIPTION OF THE DRAWINGS

The invention will now be described in more detail with reference to non-limiting embodiments and with reference to the accompanying drawings in which:

FIG. 4 is a sectional view of a capsule mounted on a support, FIG. 5 is a sectional view of an alternative embodiment of a capsule mounted on a support, FIG. 6 is a side view, partly as seen in a section, of still another alternative embodiment of a capsule mounted on a support, FIG. 12 is a side view of the front portion, the front-most part shown in a sectional view, of still another alternative embodiment of a capsule mounted on a support.

DETAILED DESCRIPTION

Figure 1:
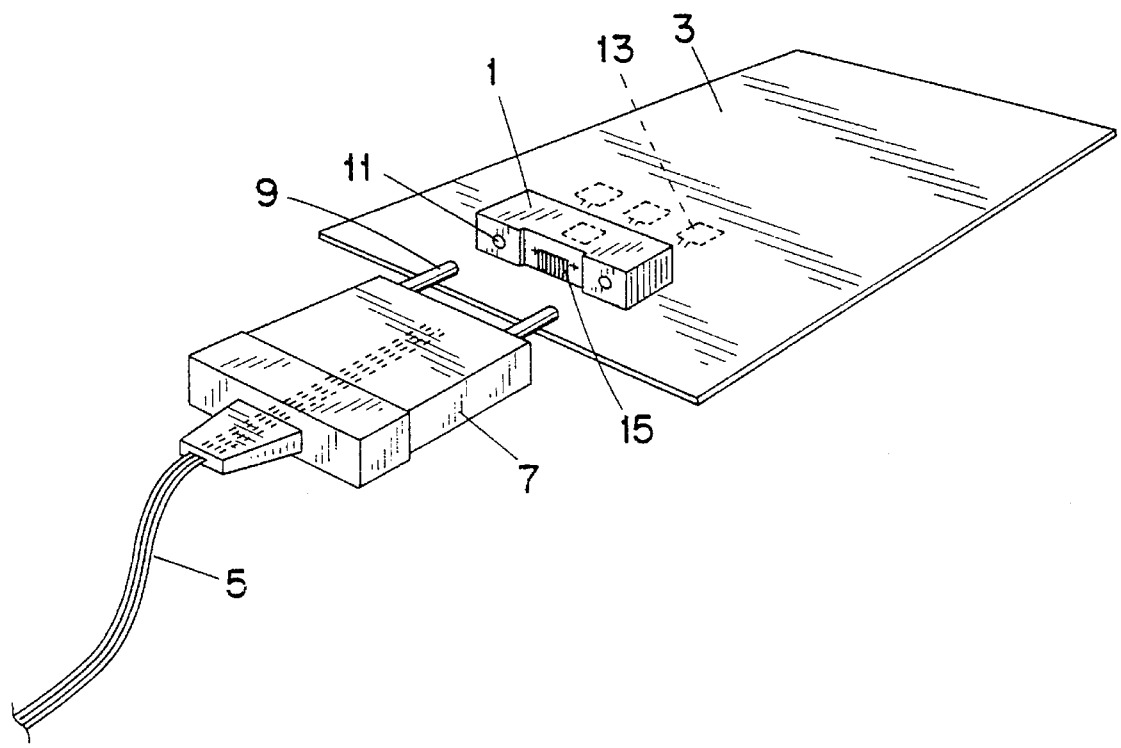
FIG. 1 is a perspective view of a circuit board including a capsule for optoelectronic components and a fiber ribbon cable having connector means.

FIG. 1 is perspective view of a capsule i including optical components mounted on a support or a substrate 3, which can be e.g. a pattern circuit board, a multichip module or some other large electronic component. The capsule is generally made of an electrically isolating, opaque material. An optical multifiber cable of fiber ribbon cable 5, comprising e.g. four optical fibers located at each other, side by side, is provided with a connector means 7. The connector means 7 can be of MT-type and has guide pins which for the coupling of the connector means 7 to the capsule 1 are intended to accurately centre the connector means 7 in relation to the capsule 1, by the fact that its guide pins 7 extend into accurately made guide bores 11 in the front side of the capsule 1. The front side of the connector is supposed to be essentially flat and the ends surfaces of the optical fibers therein constitute are a part of this front surface and are thus located in essentially the same plane as the rest of the front surface. On the substrate or carrier 3 various electronic assistant or auxiliary components, as is indicated by dotted lines 13, can be provided. Electronic auxiliary components such as driver circuits and similar parts can also be moulded into the capsule, see the description below.

Figure 2:
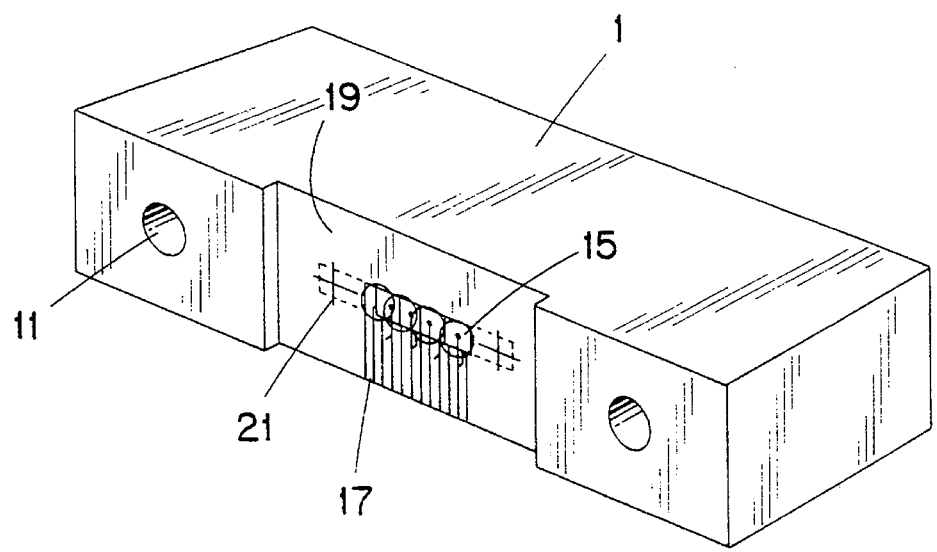
FIG. 2 is a perspective view of the capsule of FIG. 1 in a larger scale.

FIG. 2 is a view of the capsule itself as illustrated in a larger scale. On the front side or surface thereof, in addition to the guide holes 11, surface mounted and/or encapsulated optoelectronic components 15 are arranged. These components 15 can e.g. be PIN diodes, light emitting diodes or light detecting elements and they may possibly be integrated with some electronic circuits. In the case shown a group or "array" of PIN diodes are illustrated. The components can be connected through bare electrically conducting wires (26, see FIG. 4) (be "wire bonded") of a suitable material to electrical conductor paths 17, which are also arranged on the front side surface of the capsule 1 and extend from the components 15 straight downwards to the bottom side of the capsule 1.

Centrally on the front side of the capsule 1 a shallow depression or recess 19 is provided, where the components 15 are placed, so that they are located retracted in relation to the other portions of the front side. The guide holes or bores 1 for the guide pins 9 of the connector means 7 are however arranged in these other portions of the front side. Thereby, when inserting the optical connector means 7 including its guide pins 9 into the capsule 1 a controlled or predetermined, small distance can be maintained between the exterior optical connector surfaces of the optical components 15 and the corresponding coupling surfaces of the optical connector means 5, in practice the end surfaces of the optical fibers which are comprised in the fiber ribbon cable 5. The term "small distance" is here to be taken as having the same magnitude of order as the thickness of the components or diameter of the light waveguides or less. Thereby it is avoided that the connecting surfaces are damaged by compression forces when attaching the optical connector means 7. On the recessed portion 9 of the front side of the capsule 1 also markings 21 are provided in the shape of guide crosses, e.g. made as shallow and distinct grooves in the surface of the capsule material, for facilitating a required accurate positioning of the optical components 15 on the front side of the capsule, in particular in relation to the position of the holes 11 for the guide pins. The recessed portion also provides a protection of the conductors and wires 26, 17 also located in the recess.

Figure 3A:
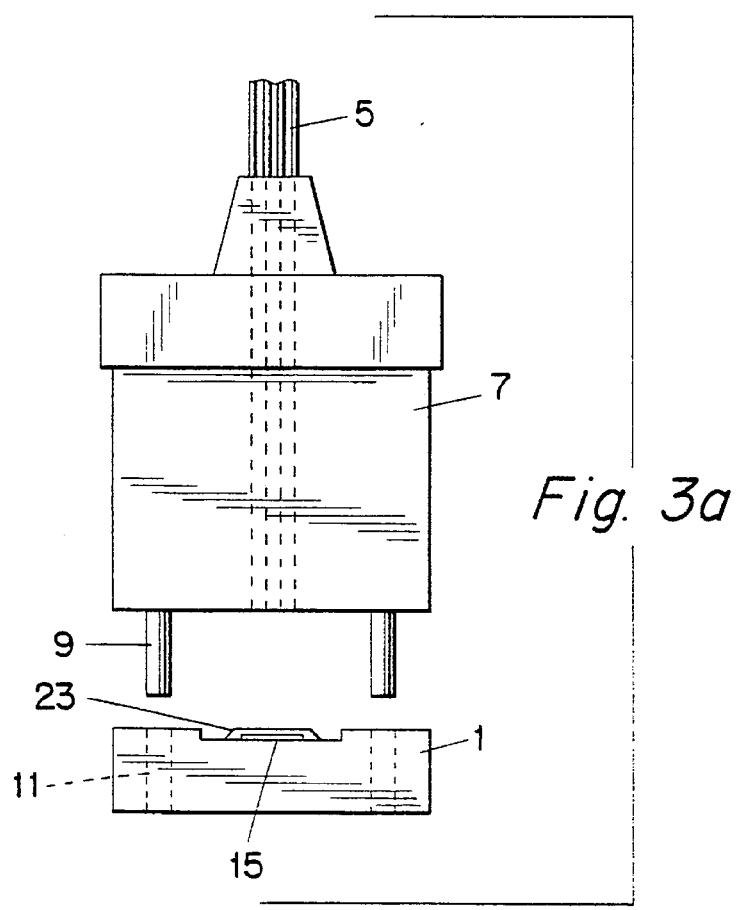
FIG. 3a is a view of the capsule and the connector means as seen from above for coupling the connector means thereto.
Figure 3B:
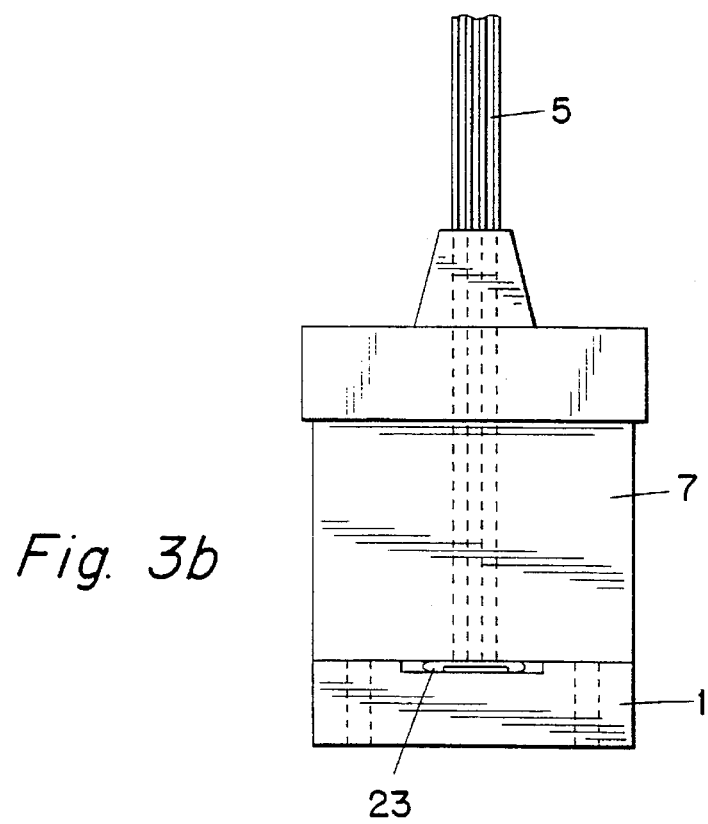
FIG. 3b is a view similar to FIG. 3a but here the connector means are placed against the capsule.

FIG. 3a is a view from above and schematically of the capsule 1 and the optical connector means 7 before attachment of the connector means. It can be seen here that the front coupling surfaces, which may be the active surface, of the optical components 15 are located a little inside the plane through the other portion of the front surface, as has been mentioned above, for protecting the delicate components. In order to still arrange a good optical coupling the optical components 15 are covered by an elastic encapsulating material or layer 23, e.g. of silicon rubber, having an adapted refractive index. Thereby a completely air-tight or hermetic transition or continuation is obtained between the ends of the optical fibers in the fiber ribbon cable 5 and the optical coupling surfaces of the optical components 2, whereby light reflections are reduced at these surfaces in the case where the refractive index of the layer 23 is appropriately chosen. In FIG. 3b the same parts are illustrated when they are brought against each other, the layer 23 which has its refractive index adapted being somewhat compressed against the flat front surface of the optical connector means 7, where the end surfaces of the optical fibers in the fiber cable 5 are arranged.

FIG. 4 is a schematic view of the capsule 1 mounted on the support 3 as seen in a cross section of the capsule 1. In this figure the bonding wires 26 are seen which connect electrically the components 15 to the fixedly arranged conductor paths 17 on the front side of the capsule 1. It can be further seen that the electrical conductors 17 on the front side of the capsule 1 continue as electrical conductors 25 on the bottom side of the capsule 1. These conductors 25 on the bottom side are then through tin solder 27 or a similar material such as a conducting adhesive electrically connected to conductive paths 29 on the top side of the support 3. These conductive paths are in turn connected through soldered or bonded wires 31 to electrical terminals on a circuit plate 33 including integrated electronic circuits such as suitable driver circuits, which are attached to the top surface of the support 3.

FIG. 5 is a view similar to that of FIG. 4, illustrating a somewhat different mounting of the optical components 15 is illustrated. Here they are attached directly to an electronic integrated circuit located below the components in the shape of a plate 35. The integrated circuit plate 35 is moulded into the capsule 1 itself on the front side thereof, so that the top or front surface of the integrated circuit 35 is located in the same plane as the other portion of the bottom surface in the recess 19. In this case the bonding wires 26 connect electrical terminals on the integrated circuit plate 15 to the electrical conductive paths 17 on the front side of the capsule 1. Thereby no separate driver circuits are needed since they may be arranged directly inside the capsule 1.

Another alternative embodiment is illustrated in the view of FIG. 6 which is also similar to that of FIG. 4. An electronic integrated circuit plate 37 is here moulded into the capsule 1 and is connected in the same way as a conventional encapsulated integrated circuit. Thus, also a lead frame 39 of an electrically conducting material is moulded into the capsule 1 having exterior electrical connector tongues or legs 41. These legs are as above attached by means of tin solder or a similar material to conductive paths 29 on the support 3. The electrical connection between the integrated circuit 37 and the lead frame 39 is accomplished by means of bonding wires 43. From the lead frame 39 suitable conducting portions protrude through the front surface of the capsule 1, as is indicated at 45, where the electrically conducting wires 26 connect the optical components 15 to precisely these conductors in the lead frame 39 and therethrough to the integrated circuit.

Figure 7:
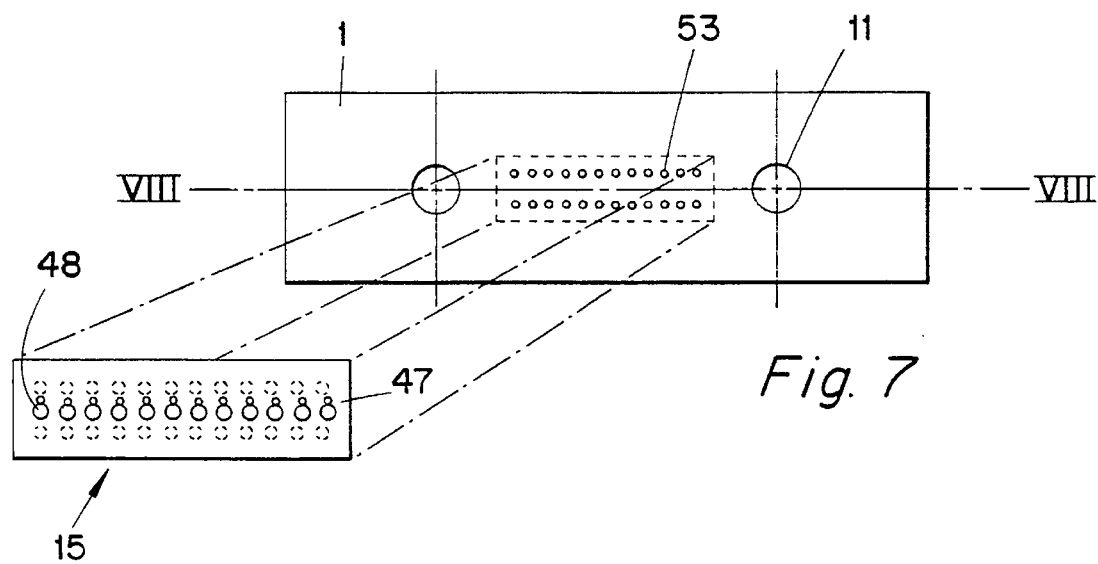
FIG. 7 is a view of the front side of another embodiment of the capsule with an associated optocomponent plate.
Figure 8:
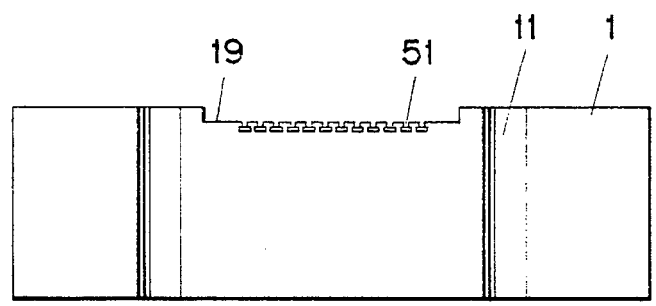
FIG. 8 is a sectional view of the capsule according to FIG. 7 without any components.
Figure 9:
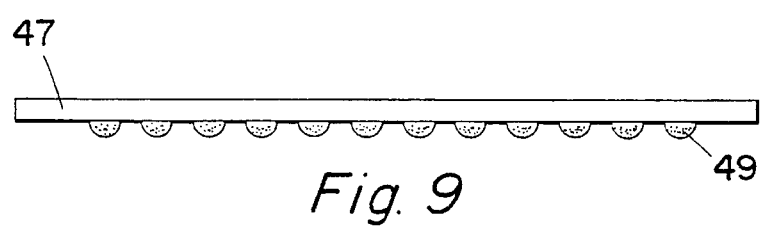
FIG. 9 is a sectional view, in a larger scale, of the component plate according to FIG. 7 as seen before mounting.
Figure 10:
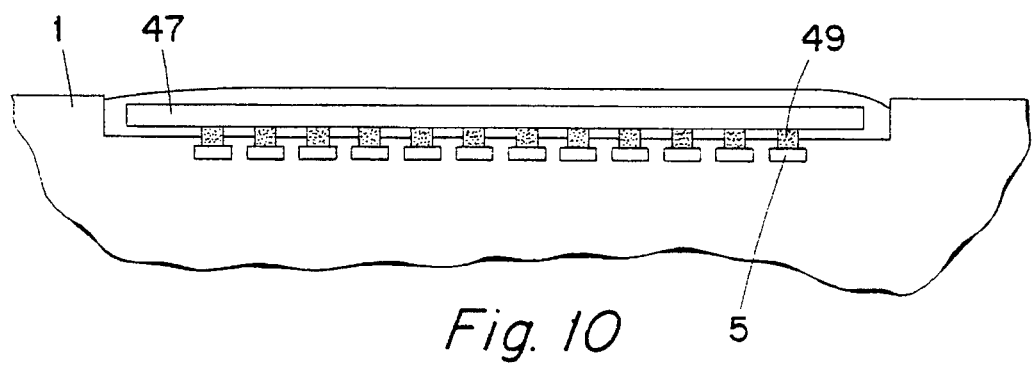
FIG. 10 is a larger scale, sectional fragmentary view of the capsule according to FIG. 7 showing a part of the front portion of the capsule including an attached component plate.

Another possible mounting of the optical components 15 and the capsule 1 is illustrated in the FIGS. 7–10. Here FIG. 7 is a view of the front side of the capsule 1 without any mounted optical component 15. They exist as a plate 47 shown in this Figure as located at a distance from the capsule and comprising optical elements arranged thereon, which have optical connector surfaces shown at 48. In FIG. 8 the capsule 1 is shown in a sectional view along the broken line VIII in FIG. 7, where the portion around the optical component 15 including a mounted optical component plate 47 is illustrated in a larger scale in FIG. 10. The plate 47 of the optical component 15 is constructed to comprise electrical connection terminals on the rear side thereof and on these terminals, before mounting the plate, very accurately placed small areas or isles 49 of a solder or of a conducting adhesive are provided, as appears from the cross sectional view of the component plate in FIG. 9.

On the front side of the capsule 1 blind holes 51 having a small diameter are arranged, see FIG. 8, which are placed in correspondence to the isles 49 on the component plate 47, so that the relative locations of the centre lines in the isles 49 coincide with the relative locations of the axes of the circular holes 51. At the bottom of the rather short holes 51 portions of electrical conductors 53 are arranged which are moulded into the capsule 1 with the portions illustrated at a small distance from the surface of the capsule in the recess 19 and they may for instance belong to a lead frame, not shown. The holes 53 are located centrally in the recess 19 and in an accurate position in relation to the bores 11 for guide pins.

For mounting and connecting the component plate 47 it is placed first rather accurately at its position, so that the isles 49 will be positioned at least partly above the mouths of the holes 51. Then the front surface of the capsule 1 where the recess 19 is located is suitably positioned so that it is directed upwards. For a hole diameter of e.g. 0.1 mm and a diameter of the isles 49 of approximately of the same size an alignment laterally of the plate 47 comprising only about 0.1 mm is required which is easily accomplished e.g. in an automatic pick-and-place-machine for mounting electronic components or even manually. After that the plate remains in a position located on the front surface of the capsule 1 which is directed upwards and the plate is free to move thereon laterally along the surface. Then the component plate 47 and the front surface of the capsule 1 inside the recess are heated so that also the portions of the electrical conductors 53 at the bottom of the holes 51 will be sufficiently hot. Then the material of the solder isles 49 is melted, if it is a tin solder, and in any case the material will be liquid and fills the holes 51 and will come in contact with the electrical conductors 53.

For suitable surface tension forces in the liquid material this process will be occur completely automatically and in addition the surface tensions forces will tend to pull the plate 47 laterally so that the isles 49 adjust themselves centrally above the respective hole 51, whereby an automatic alignment of the plate 47 providing a very good accuracy is obtained, simultaneously with the electrical connection. After that the mounted assembly is allowed to cool. Thus, there must be sufficient material included in each one of the isles 49 for completely filling one of the holes 51 and in fact each one of the isles 49 must contain even more material for securing sufficient surface tension forces for the automatic alignment operation. The isles 49 will then generally have an approximately semi-spherical shape of a diameter larger than the diameter of the holes 51.

Figure 11:
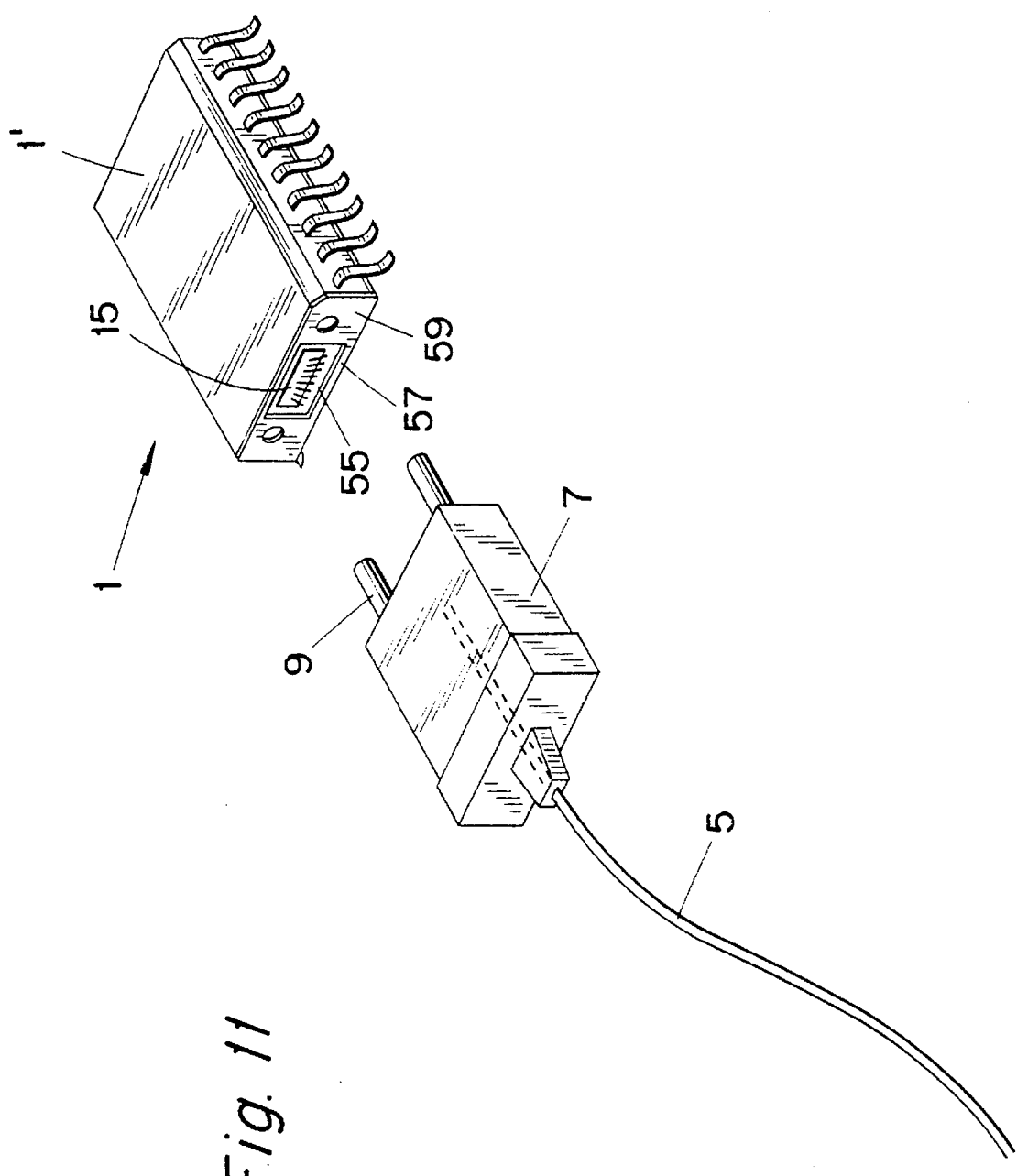
FIG. 11 is a perspective view similar to FIG. 1 of an alternative embodiment of a capsule for optoelectronic components and a fiber ribbon cable having connector means.

An alternative embodiment of the capsule is illustrated in FIG. 11. The component plate 15 is here mounted on the bottom of a recess 55, the recess 55 having sidewalls all around for protection of the component plate 15 and its possible electrical connections. Thus the recess 55 has a generally rectangular shape as viewed at the front, coupling surface of the capsule 1, the sides or edges of the recess being located in parallel to sides of the generally rectangular capsule 1. Thus in particular narrow ribs 57 are located at the lower and top side of the recess, the front surface of the ribs being located at the same level as the other non-recessed portions of the capsule front surface.

The recess 55 having sidewalls all around can be produced when the capsule is moulded but it can also be accomplished by attaching an apertured plate 59 to the flat front surface of a capsule block 1'. This flat surface can then first be made by suitably grinding and polishing a moulded block, where in the abrasive operation also ends of electrical conductors are exposed, to which the components of the component plate 15 can be electrically connected by wire-bonding, see also FIG. 6. Then the flat plate 59 is attached permanently, by means of some suitable adhesive, in an accurate position on the front surface, the guide holes for the guide pins in the plate and in the capsule block being used for the positioning.

In FIG. 12 a view similar to that of FIG. 6 is shown, the component 15 being attached to the bottom surface of the recess 19 or 55 by means of solder bumps 61 or bumps of an electrically conducting adhesive etc., some of which are also connected to the exposed ends of conductors of a leadframe moulded into the capsule 1.

Figure 13A:
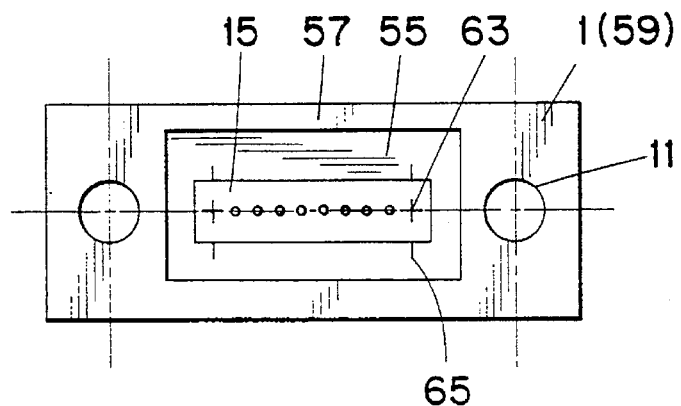
FIGS. 13a, 13b and 13c are schematic front views which illustrate various ways of accurately positioning a component plate.
Figure 13B:
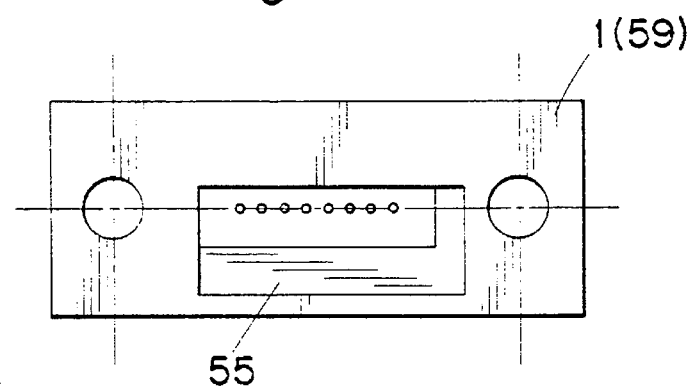
Figure 13C:
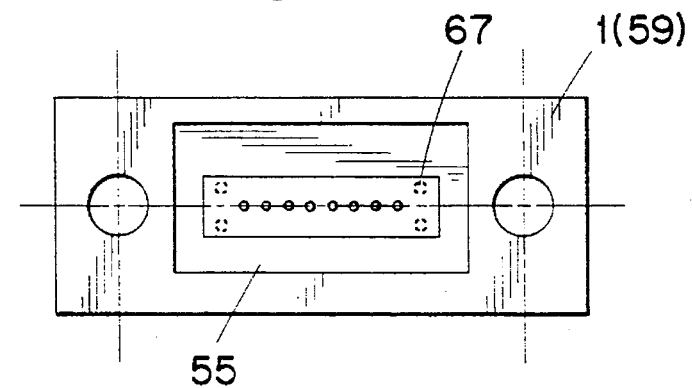

Methods of accurate positioning the component plate 15 at the front side or generally at an available or freely facing side of the capsule 1 are illustrated in FIGS. 13a–13c for the case where a recess 55 having sidewalls all around is used. In the first case, according to FIG. 13a, cross-shaped marks 63 on the component plate or chip 15 are arranged which are to be positioned at the interconnection line between the longitudinal central axes of the guide bores 19 for the guide pins and precisely symmetrical at or on that line, so that there is the same distance from the marks 63 to its neighbouring guide hole 11. Therefor also marks in the form of straight lines 65 made at the bottom of the recess are used.

According to the embodiment of FIG. 13b instead one corner of the rectangular recess 55 is used for the positioning operation, the component plate 15 being attached in the position where two connected edges thereof are engaged with two adjoining sidewalls of the recess 55. In FIG. 13c the positioning of the component plate 15 is made by guide heels/projections or holes produced at the recess bottom surface in the moulding operation and by corresponding guide holes or projections at the rear side of the component carrier 15, the guide means being generally indicated at 67. Also guide projections or platforms protruding from the bottom surface of the recess for engaging no adjacent edges of the component chip 15 can be used, this case being not shown.

I claim:

1. An optical component capsule for coupling to an optical connection, the capsule comprising:

a first surface that is accessible when the capsule is mounted;

at least one optoelectronic component mounted on the first surface of the capsule, having at least one optical exterior coupling surface for coupling to a wave guide for light or an optical fiber, electrical connections, and guides for receiving a means for guiding, wherein the guides are arranged in or at the capsule and include axes extending into a plane of the first surface of the capsule, and a recess or depression in the first surface of the capsule, the recess or depression having a bottom surface, wherein the component is mounted on the bottom of the recess or depression so that all portions of the component are located below or behind the level of the non-recessed or non-depressed portion of the first surface, and when pushing a connector having a flat front coupling surface, the coupling surface will only mechanically contact the non-recessed or non-depressed portion of the surface with a substantially small distance remaining between the coupling surface and the nearest portions of the component.

2. A capsule according to claim 1, wherein the recess or depression has sidewalls around its bottom surface.

3. A capsule according to claim 2, further comprising an apertured plate, wherein the first surface of the capsule is formed by one side of the plate, the other side of the plate is attached to another part of the capsule and the recess or depression is formed by the aperture in the plate.

4. A capsule according to claim 1, wherein the recess or depression is of a size that there is a substantial free area of the bottom surface between the component and sidewalls of the recess.

5. A capsule according to claim 1, further comprising an elastic protective layer arranged on top of the component, the layer having a thickness sufficient for contacting and surfaces of waveguides in a connector when it is coupled to the capsule and being of a material having a refractive index for reducing reflections of light at end surfaces of the waveguides in the connector means and at surfaces of the component.

6. A capsule according to claim 1, wherein the guides comprise bores or holes having axes extending into the first surface of the capsule perpendicularly thereto.

7. A capsule according to claim 1, wherein the bores or holes for the guide pins extend into the non-recessed or non-depressed portion of the first surface.

8. A capsule according to claim 1, further comprising two bores or holes for guide pins, the component being mounted so that its optical coupling surface is located having its center on the connection line between these bores or holes.

9. A capsule according to claim 1, further comprising two bores or holes for guide pins, the component being mounted so that its optical coupling surface is located having its center located centrally between these bores or holes.

10. A capsule according to claim 1, further comprising two bores or holes for guide pins, the component comprising several components which are mounted so that their optical coupling surfaces are located having their center points evenly distributed and centered on the connection line between the bores or holes.

11. A capsule according to claim 1, further comprising several components which are arranged in or mounted on a plate shaped carrier attached to the first surface of the capsule.

12. A capsule according to claim 1, further comprising conductors arranged on the recessed or depressed surface of the capsule where the component is mounted for connection to electrical connection terminals of the component.

13. A capsule according to claim 12, wherein the electrical conductors are arranged to continue from this surface to a bottom surface of the capsule for connection to electrical connectors on a substrate or support having electrical conductive paths arranged thereon.

14. A capsule according to claim 13, wherein the substrate or support is a circuit board.

15. A capsule according to claim 1, further comprising electrical conductors molded into the capsule having end regions at the surface where the component is mounted for connection to electrical connection terminals of the component.

* * * * *